(12) United States Patent
Jones, III (10) Patent No.: US 6,346,908 B1
(45) Date of Patent: *Feb. 12, 2002

(54) APPARATUS FOR CONVERTING AN ANALOG SIGNAL UTILIZING RESISTOR D/A CONVERTER PRECHARGING

(75) Inventor: Robert S. Jones, III, Austin, TX (US)

(73) Assignee: Motorola, Inc., Schaumburg, IL (US)

(*) Notice: Subject to any disclaimer, the term of this patent is extended or adjusted under 35 U.S.C. 154(b) by 0 days.

This patent is subject to a terminal disclaimer.

(21) Appl. No.: 09/574,754

(22) Filed: May 18, 2000

Related U.S. Application Data

(63) Continuation of application No. 09/128,274, filed on Aug. 3, 1998.

(51) Int. Cl.[7] .............................................. H03M 1/12
(52) U.S. Cl. ...................................... 341/172; 341/154
(58) Field of Search ................................ 341/172, 154, 341/144, 161, 155, 153, 163

(56) References Cited

U.S. PATENT DOCUMENTS

| 4,618,852 A | 10/1986 | Kelley et al. ............... 340/347 |
| 4,794,374 A | 12/1988 | Koike ......................... 341/120 |
| 4,875,046 A | 10/1989 | Lewyn ........................ 341/148 |
| 5,717,396 A | 2/1998 | Gross, Jr. et al. ............ 341/166 |
| 6,130,635 A | * 10/2000 | Jones, III ................... 341/172 |

* cited by examiner

Primary Examiner—Peguy JeanPierre (57) ABSTRACT

A method for operating a circuit in an analog to digital converter, including providing a resistor network (205) having a plurality of resistor banks (200) connected together, each resistor bank of the plurality of resistor banks having a plurality of resistors (210) connected together in series and a plurality of first switches (220) for selecting a node (215) between adjacent resistors, and a plurality of second switches (235) for selecting a chosen resistor bank of the plurality of resistor banks. A first switch is closed in a chosen resistor bank to charge a parasitic capacitance (250), and a second switch is closed after closing the first switch, and after charging the parasitic capacitance in the chosen resistor bank.

19 Claims, 6 Drawing Sheets

APPARATUS FOR CONVERTING AN ANALOG SIGNAL UTILIZING RESISTOR D/A CONVERTER PRECHARGING

This is a continuation of Ser. No. 09/128,274 filed May 3, 1998.

FIELD OF THE INVENTION

The present invention generally relates to analog-to-digital converters (ADCs), and more particularly, to a method of converting an analog signal to its digital equivalent in an ADC.

BACKGROUND OF THE INVENTION

ADCs, either stand alone or as an embedded module in a processing system, are used in a variety of applications for converting analog signals to their digital equivalent signals. Within an ADC, RDACs (resistor digital-to-analog converters) have been used to convert digital signals to its analog equivalents within ADCs. The converter process typically proceeds by an input signal or derivation thereof being compared with a reference signal generated by an RDAC. Through multiple comparisons the input signal is approximated by a digital value. The RDAC configuration may be one of several configurations. For example, the resistors of an RDAC may be aligned in series or in parallel, may have differing values, and may be replaced with capacitors. The configuration of the resistors or the capacitors in an RDAC are generally optimized in order to reduce the RC (resistor capacitor) delay associated with such a configuration. Several alternative configurations have been used to reduce this RC delay. For example, a sampling capacitor located at the output of the digital-to-analog converter can be reduced, while other components such as the resistors in the RDAC may also be smaller. In addition, a total equivalent resistance of the network may also be reduced. However, these alternative configurations cause several problems. First, the reduction of the sampling capacitance reduces the accuracy of the digital-to-analog conversion. Placement of the resistors in parallel rather than in series requires more power in the system. Accordingly, a need exists to create an RDAC and RDAC configuration that reduces the RC delay without these disadvantages of the prior art. In particular, a need exists for a technique for reducing the RC delay that may utilize a digital solution rather than an analog solution in order to simplify the RDAC process.

BRIEF DESCRIPTION OF THE DRAWINGS

A better understanding of the present invention can be obtained when the following detailed description of a preferred embodiment is considered in conjunction with the following drawings, in which.

DETAILED DESCRIPTION OF A PREFERRED EMBODIMENT

The embodiments of the present invention will now be described in detail with reference to FIGS. 1–6.

Figure 1:
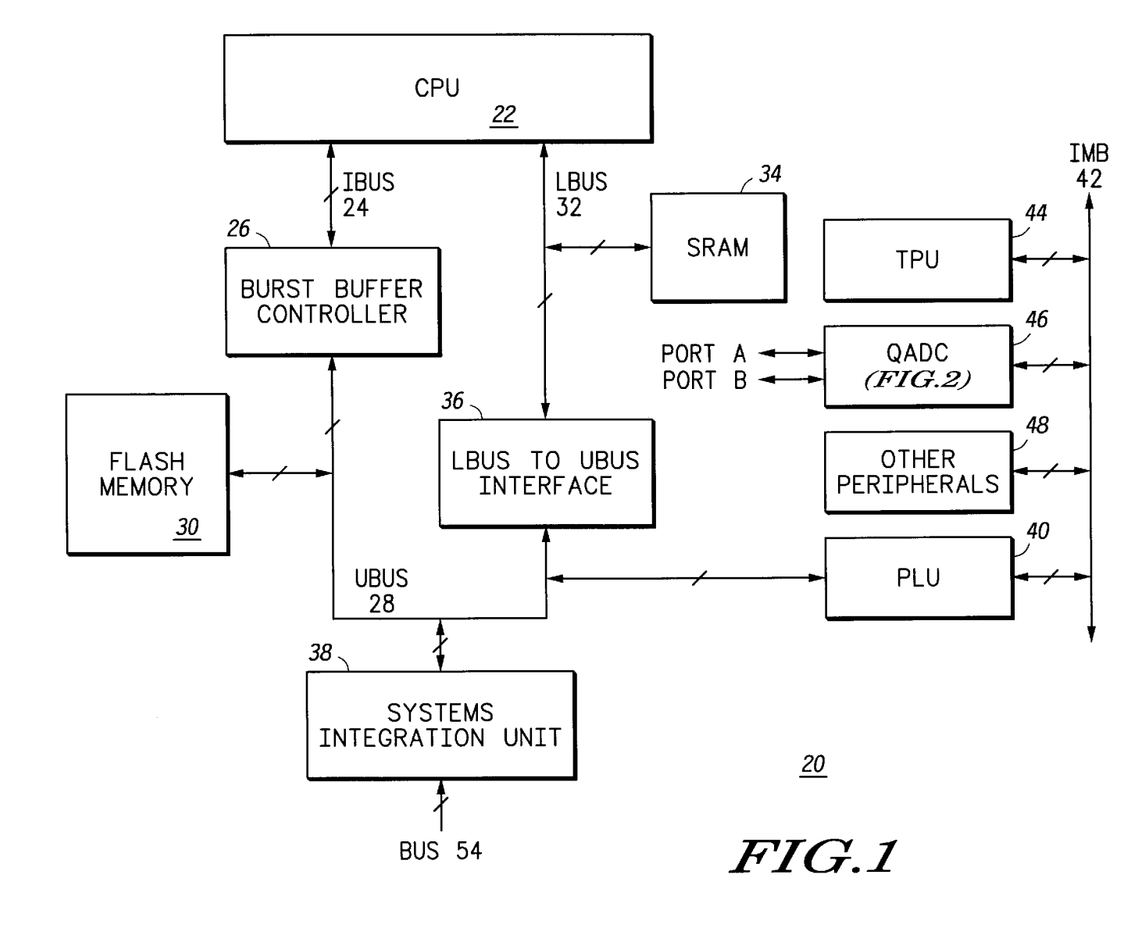
FIG. 1 illustrates, in block diagram form, a queued A/D converter (QADC), embedded in a processing system.

FIG. 1 illustrates, in block diagram form, a queued A/D converter (QADC), embedded in a processing system, such as a microprocessor. In FIG. 1, the processing system 20, in this embodiment, has the structure and function of a microprocessor with the test circuits of the present invention located in the QADC 46. The QADC 46 is bidirectionally coupled to an IMB (internal memory bus) 42 by a plurality of I/O (input/output) pins to "set up" the QADC 46 by sending initial test information to the QADC 46. By doing this, the QADC is placed into a particular test mode by writing a test number to registers located in the QADC 46. By "queued", it is understood that the A/D converter operates in response to one or more queues of Conversion Command Words (CCW) as described in more detail below. Eight of the I/O pins [0:7] of the QADC 46 function as Port A while another eight function as Port B. After the test information is sent through the IMB 42 to "set up" the testing of the QADC 46, the test results of the QADC are sent through Port A and Port B, which are bidirectionally coupled to the QADC 46 to transfer information to a user to avoid using the IMB 42 to report results.

The processing system 20 of FIG. 1 further has a central processing unit (CPU) 22 that is bidirectionally coupled through an Ibus 24 to a burst buffer controller 26 and through an Lbus 32 to an Lbus to Ubus Interface 36. Non-volatile flash memory 30 is bidirectionally coupled to the Ubus 28 and static random access memory (SRAM) 34 bidirectionally coupled to the Lbus 32 on the processing system 20. The burst buffer controller 26 is bidirectionally coupled to the Lbus to Ubus Interface 36 via the Ubus 28, while the Ubus 28 is bidirectionally coupled to the PLU 40. Other peripherals 48, the PLU 40 and a TPU 44 are bidirectionally coupled to the IMB 42. A systems integration unit 38 is bidirectionally coupled to the Ubus 28 and has inputs from a bus 54. Conventional static random access memory 34 is bidirectionally coupled to the Lbus 32.

In operation, CPU 22 executes instructions that are fetched from flash memory 30 using burst buffer 26, or fetched from external memory on bus 54 using SIU 38. Bi-directional access to the modules on the IMB 42, for example, TPU 44, QADC 46, and other peripherals 48, is performed through UBUS to IMB interface 40. Operating modes and instructions are programmed by CPU 22 into various registers in the modules (not shown) while data is read back from other registers in the modules. The modules may also interface to the system external to data processing system 20 via ports (not illustrated).

Figure 2:
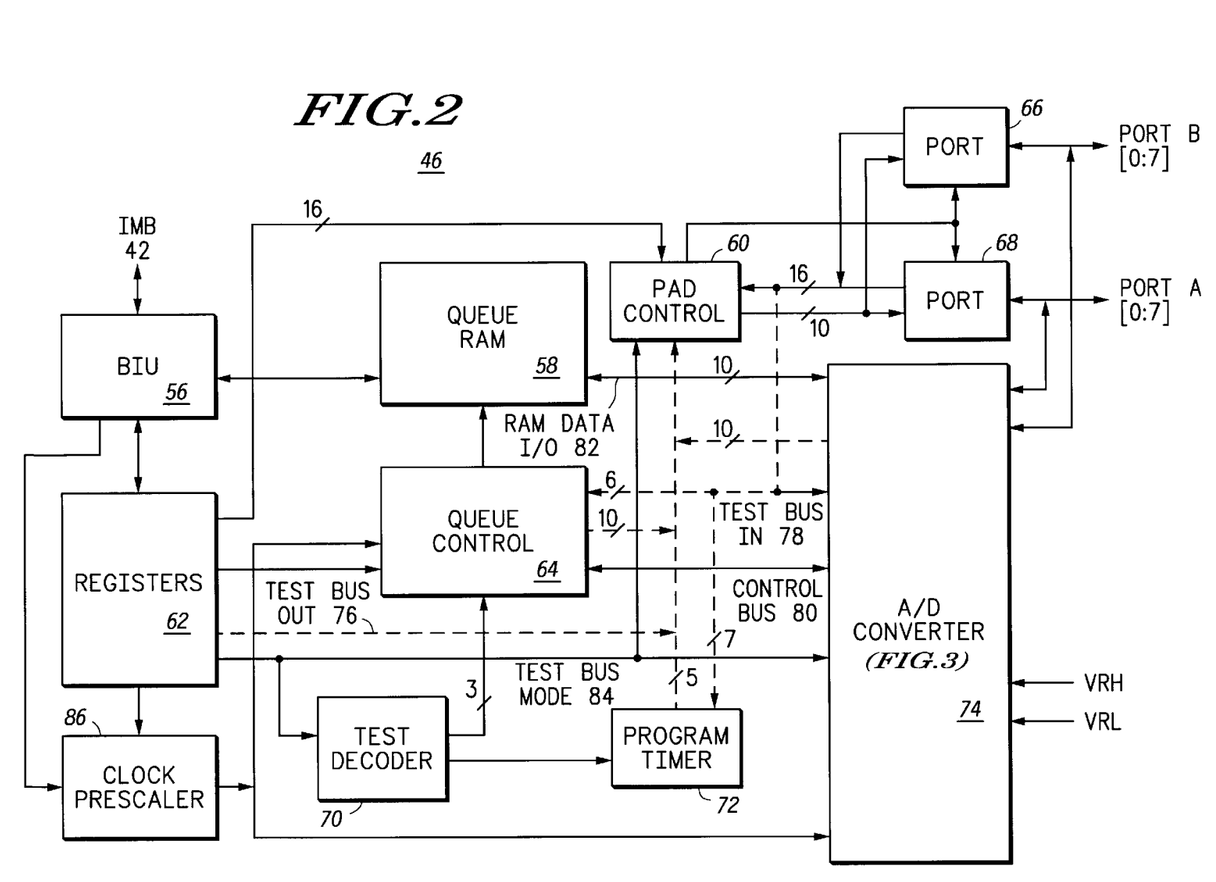
FIG. 2 illustrates, in block diagram form, the QADC of FIG. 1.

FIG. 2 illustrates, in block diagram form, QADC 46 of FIG. 1. QADC 46 includes bus interface unit (BIU) 56, queue random access memory (RAM) 58, pad control 60, registers 62, queue control 64, port 66, port 68, test decoder 70, program timer 72, clock prescaler 86 and A/ID converter 74. BIU 56 is bidirectionally coupled to IMB 42 to receive data and instructions via IMB 42 and provides control information to queue control 64 through registers 62 and bidirectionally exchanges data with queue RAM 58. BIU 56 is also bidirectionally coupled to register 62. Queue RAM 58 is a conventional static random access memory and can be accessed via either BIU 56 or A/D converter 74. Queue control 64 controls the operation of queue RAM 58 based on control information received from registers 62 and controls the operation of A/D converter 74 via control bus 80.

Registers 62 further provide data to test decoder 70 which, in turn, provide information to program timer 72 and queue control 64. Registers 62 also provide data to the A/D converter 74 via the test bus mode 84. A high reference voltage (VRH) and a low reference voltage (VRL) are provided into the A/D converter 74. Pad control 60 is bidirectionally coupled to both ports 66 and 68, which, in turn, are bidirectionally coupled to Port A and Port B, respectively. Based on control information received from register 62, pad control 60 controls the transfer of information to and from ports 66 and 68. In the illustrated embodiment, port 66 is used for inputting and outputting information from QADC 46 to or from data processing system 20. Likewise port 68 bidirectionally couples information from QADC 46 to or from data processing system 20. Each port couples to eight terminals or pads, although the number of terminals or pads are not important for purposes of illustrating the invention. Again, as detailed above, the use of port 66 and port 68 to send and receive information outside of the QADC 46 through Port B and Port A, respectively, provides increased testing time and improved controllability and testability of QADC 46.

Also in FIG. 2, a clock prescaler 86 receives clock signals from IMB 42 via BIU 56 and, based on control signals received from registers 62, provides a divided clock signal to queue control 64 and to A/D converter 74. A test bus labeled test bus out 76 (dashed lines) is coupled to receive test data from registers 62, queue control 64, program timer 72, and A/D converter 74, and to provide the test data to either Port A or Port B via pad control 60. Likewise, a test bus labeled test bus in 78 receives test data from Port A and/or Port B and provides test data to A/D converter 74, queue control 64 and program timer 72. The test bus in 78 and test bus out 76 also provide significant benefits. By coupling the test buses 76, 78 to various sub-modules on the QADC 46, these sub-modules can be tested separately and independently through Port A and Port B. In essence, the test buses 76, 78 provide the direct testing benefits described above with regard to Fort A and Port B that avoid the use of the IMB 42. By sending the test results directly to a tester through Port A and Port B, the controllability and observability of the test are increased. Thus, a tester is able to use the test bus in 76 and the test bus out 78 to functionally test QADC 46 during the manufacturing process of data processing system 20. Further, test features have been designed into QADC 46 in order to improve controllability of testing as well as to provide better observability of results than prior art testing procedures as detailed below.

QADC 46, in the illustrated embodiment, is a ten-bit successive approximation converter. It should be apparent to one of ordinary skill in the art that the successive approximation converter could comprise more or less than ten bits and it should also be apparent that the analog digital converter may be a resistive type or a capacitive only type. During normal operation of the QADC 46, a conversion command word (CCW) is received via IMB 42 and stored in a first portion (not shown) of queue RAM 58. The CCW allows QADC 46 to automatically take multiple samples of one channel in rapid succession or to sample once from all or some of the analog input terminals. Following a conversion, the results of the conversion are put in a second portion (not shown) of queue RAM 58.

Figure 3:
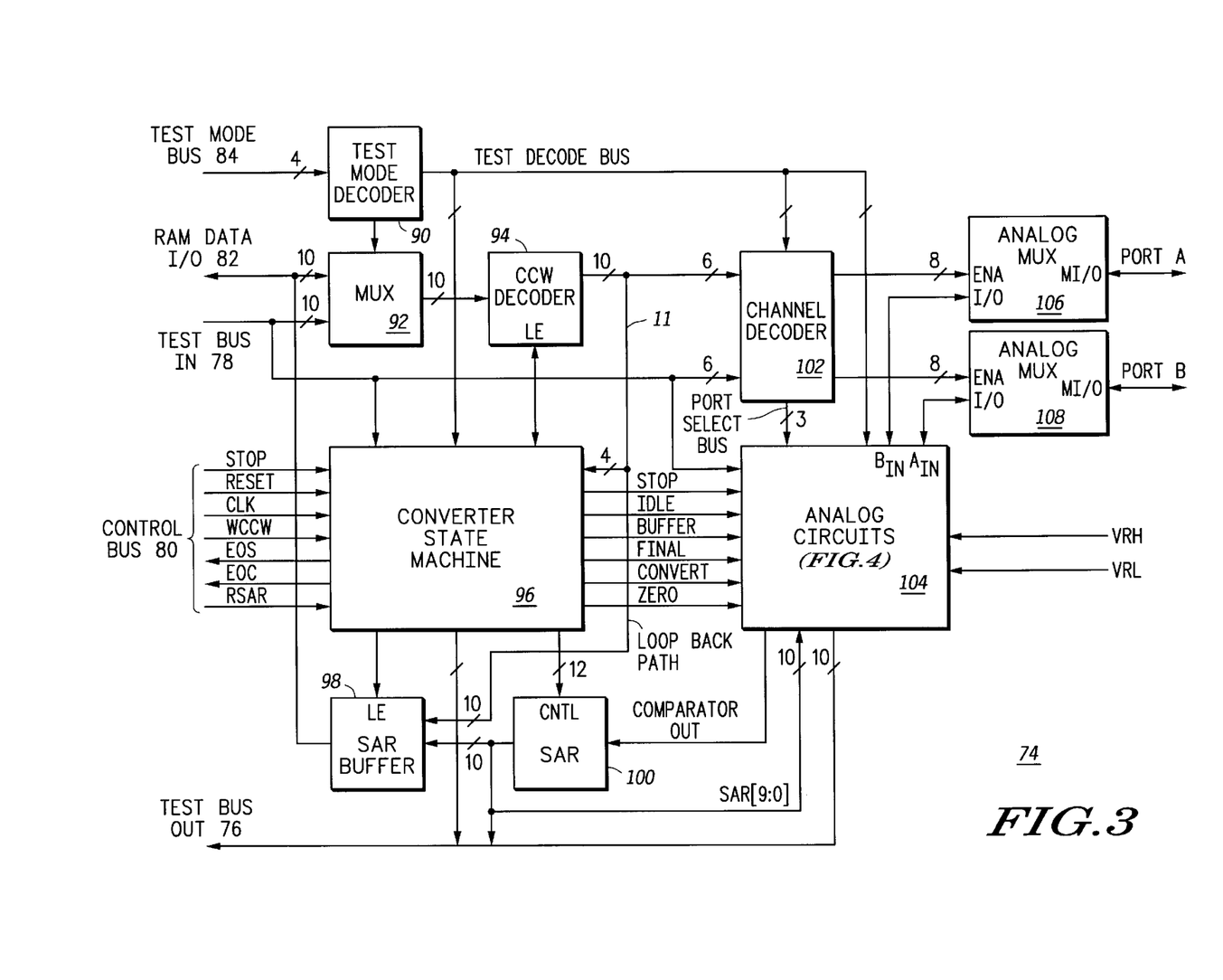
FIG. 3 illustrates, in block diagram form, the A/D converter of FIG. 2.

FIG. 3 illustrates, in block diagram form A/D converter 74 of FIG. 2. A/D converter 74 includes test mode decoder 90, multiplexer 92, CCW decoder 94, converter state machine 96, SAR (successive approximation register) buffer 98, SAR 100, channel decoder 102, analog circuits 104, analog multiplexer 106 and analog multiplexer 108. Test mode decoder 90 includes a plurality of input terminals coupled to test mode bus 84, and a plurality of output terminals labeled test decode bus coupling the decoder 90 to analog circuits 104. Multiplexer 92 includes a plurality of terminals coupled to RAM data I/O bus 82, a plurality of input terminals coupled to test bus in 78, and a plurality of output terminals coupled to CCW decoder 94. Test bus in 78 is further coupled to channel decoder 102 and to analog circuits 104. Converter state machine 96 is coupled to test bus in 78 and to the test decode bus. Also, converter state machine 96 receives and provides various control signals, including control signals labeled Stop, Reset, Clock, WCCW (write CCW), EOS (insert), EOC (insert), and RSAR to control bus 80. In response, converter state machine 96 provides control signals labeled Stop, Idle, Buffer, Final, Convert, and Zero to analog circuits 104. In addition, converter state machine 96 receives control signals from CCW decoder 94 and provides a latch enable signal to CCW decoder 94.

Channel decoder 102 has a plurality of input terminals coupled to test decode bus, a first plurality of output terminals coupled to the input enable terminals of analog multiplexer 106, a second plurality of output terminals coupled to input enable terminals of analog multiplexer 108 and a plurality of port select signals connected to analog circuit 104 through a port select bus. The channel decoder 102 also receives signals from the CCW decoder 94. Analog multiplexer 106 also includes a plurality of output terminals labeled I/O that are coupled to a plurality of input terminals of analog circuits 104 labeled $B_{IN}$. Analog multiplexer 106 also includes a plurality of terminals bidirectionally coupled to Port A and analog multiplexer 108 includes a plurality of terminals bidirectionally coupled to Port B. Analog circuits 104 have an input terminal for receiving a high reference voltage (VRH) and an input terminal for receiving a low reference voltage (VRL).

Test bus out 76 is coupled to receive signals from converter state machine 96, SAR 100, and analog circuits 104. SAR 100 receives a comparator out signal from analog circuits 104 and a plurality of control signals from converter state machine 96. In response, SAR 100 also has a plurality of output terminals providing a SAR value [9:0] to input terminals of analog circuits 104. SAR buffer 98 has a plurality of input terminals for receiving the SAR value from converter state machine 96 and a plurality of output terminals for providing the SAR value to RAM data I/O 82. A loop back path 11 connects the CCW decoder 94 to the SAR buffer 98 to allow the testing of the queues.

Figure 4:
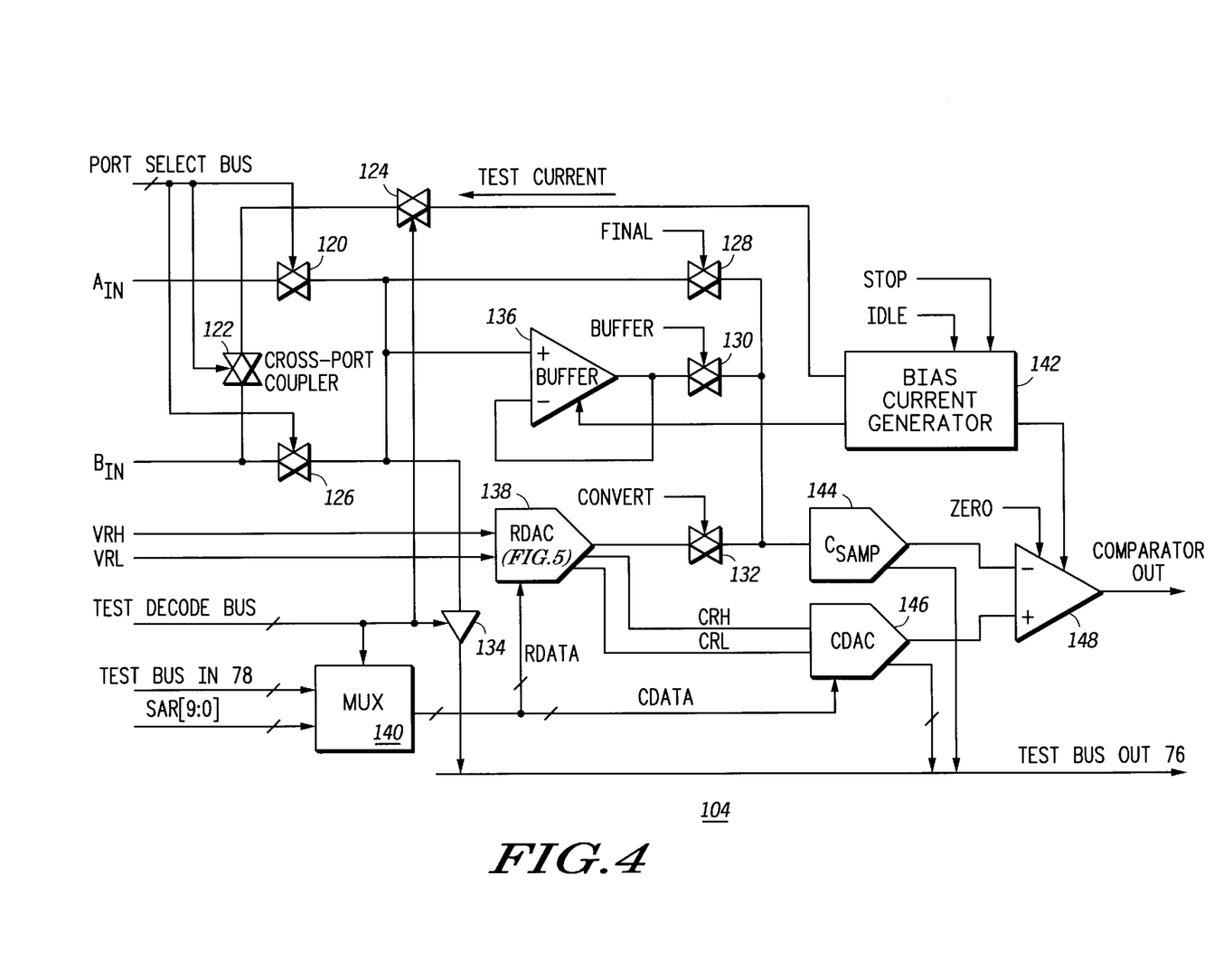
FIG. 4 illustrates, in partial block diagram form and partial logic diagram form, the analog circuits of FIG. 3.

FIG. 4 illustrates, in partial block diagram form and partial logic diagram form, analog circuits 104 of FIG. 3. Analog circuits 104 include transmission gates 120, 124, 122, 126, 128, 130, and 132, buffer 136, RDAC 138, multiplexer 140, bias current generator 142, capacitance sample circuit 144, CDAC 146 and comparator 148. Transmission gate 120 has an input terminal for receiving an input labeled $A_{IN}$, a control terminal for receiving a port select bus signal, and an output terminal. Transmission gate 122, labeled cross port coupler, has an input terminal for receiving $A_{IN}$, a control terminal for receiving the port select bus signal and an output terminal. Transmission gate 124 has an input terminal for receiving signal $B_{IN}$, a control terminal connected to the test decode bus, and an output terminal. Transmission gate 126 has an input terminal for receiving a signal labeled $B_{IN}$, a control terminal for receiving the port select bus signal, and an output terminal. Transmission gate 128 has an input terminal connected to the output terminal of transmission gate 120, a control terminal for receiving a control signal labeled FINAL, and an output terminal. Buffer circuit 136 has a first input terminal connected to the output terminal of transmission gate 120, a second input terminal, a control terminal for receiving a bias signal from bias current generator 142 and an output terminal connected to an input terminal of transmission gate 130. Transmission gate 130 also includes a control terminal for receiving a control signal labeled Buffer, and an output terminal connected to the output terminal of transmission gate 128 as well as a connection to the input terminal of $C_{SAMP}$ 144. Buffer circuit 136 also has an output terminal connected to its second input terminal. RDAC 138 has a first input terminal for receiving a high reference voltage (VRH), a second input terminal for receiving a low reference voltage (VRL), a control terminal connected to a plurality of conductors labeled RDATA and an output terminal connected to an input terminal of transmission gate 132. Transmission gate 132 also includes a control terminal for receiving a control signal labeled Convert, and an output terminal connected to the output terminals of transmission gates 128 and 130. RDAC 138 has a second output terminal for providing a signal labeled CRH to a first input terminal of CDAC 146, and a second output terminal for providing a signal labeled CRL to a second input terminal of CDAC 146. Buffer circuit 134 has a input terminal connected to the output terminal of transmission gate 126, a plurality of control terminals coupled to the test decode bus, and an output terminal connected to the test bus out 76. Multiplexer (MUX) 140 has a first plurality of input terminals for receiving a test bus in 78 signal, a second plurality of input terminals for receiving a signal labeled SAR[9:0], an input control terminal coupled to the test decode bus, and an output terminal for providing data labeled Cdata to CDAC 146. $C_{SAMP}$ 144 has an input terminal connected to the output terminal of transmission gate 132, a first output terminal connected to a first input terminal of comparator 148, and a second output terminal connected to test bus out 76. CDAC 146 has an output terminal connected to the input terminal of comparator 148 and a plurality of output terminals coupled to test bus out. The comparator 148 also has an input signal labeled zero, an output labeled comparator out and a second input from the bias current generator 142. The bias current generator 142 further has stop and idle control inputs.

During normal operation of the analog circuits of FIG. 4, analog input signals are received by analog circuits 104 via either analog multiplexer 106 or analog multiplexer 108 (FIG. 3). The CCW designates conversion parameters for the analog input samples. The CCW's are received from queue RAM 58 via RAM data I/O 82 (FIG. 2). Conversions of each of the analog channels are controlled through channel decoder 102 (FIG. 3). The actual analog to digital conversion occurs in analog circuits 104 illustrated in FIG. 4. The results of the conversions are provided to SAR 100. SAR 100 outputs a digital output that is a result of the analog to digital conversion. While FIG. 4 illustrates one implementation of the analog to digital converter, those skilled in the art to which the present invention pertains will recognize that other analog to digital converters can also be adapted for testing in accordance with the present invention.

Figure 5:
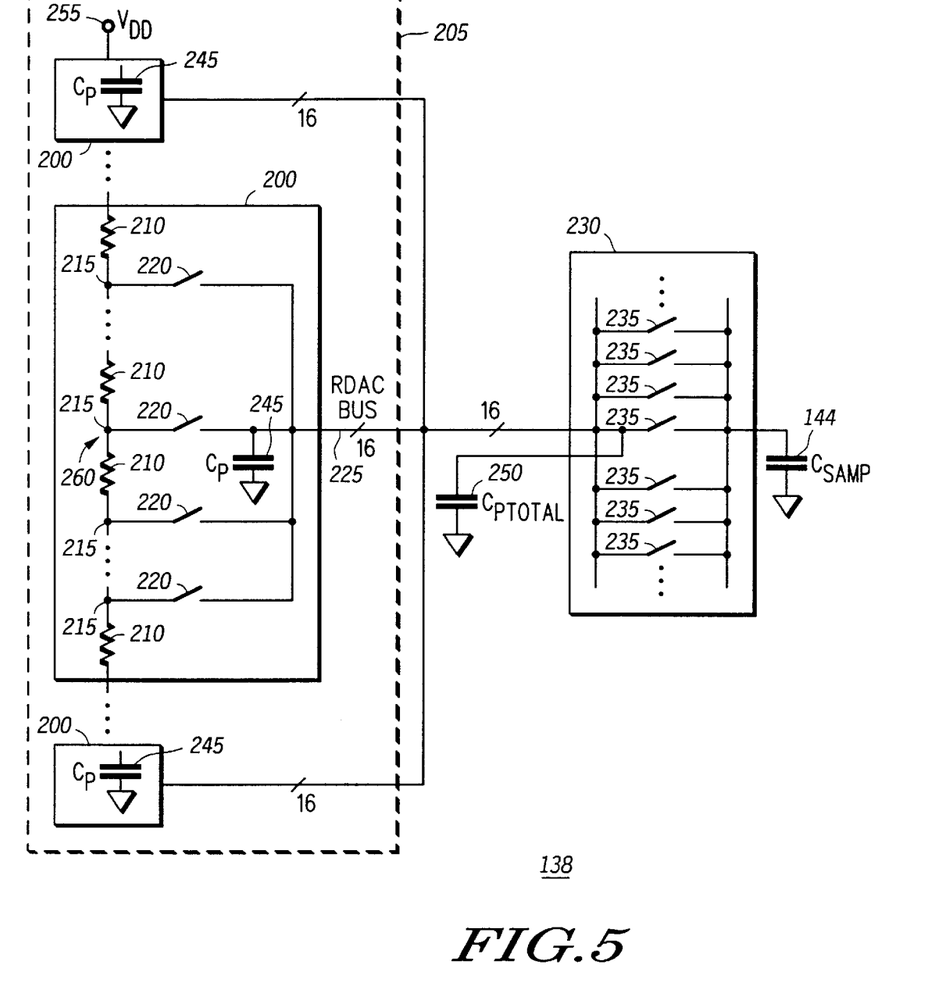
FIG. 5 illustrates, in partial schematic form and partial logic diagram form, the RDAC of FIG. 4.

FIG. 5 illustrates, in partial block diagram form and partial logic diagram form, the RDAC 138 of FIG. 4. In FIG. 5, a resistor bank 200 is one of a plurality of resistor banks that exists in a resistor network 205. Typically, the number of resistor banks 200 is sixteen. However, it is well understood that the number of resistor banks may vary. Within each resistor bank 200 are a plurality of resistors 210 that are connected in series. Between each pair of resistors 210 is a switch node 215 that couples each pair of resistors to a first switch 220. The first switches 220 are typically N-type metal oxide semiconductor (NMOS) or typically P-type metal oxide semiconductor (PMOS) transistors, however any other type of switch may be used that are commonly known in the art. The first switches 220 are electrically connected to an RDAC bus 225 comprising sixteen connections in the depicted embodiment. The RDAC bus 225 connects each of the resistor banks 200 to a second switch of a second level switching module 230 that contains a plurality of second switches 235, again being NMOS or PMOS transistors or the like.

An applied voltage ($V_{DD}$) is applied across the resistor banks 200. Each resistor bank 200 has a middle or a mid-point tap, which, in each resistor bank, is the eighth first switch node 215 located in each resistor bank. It is understood that the present invention uses the eighth switch node to reference a parasitic capacitor ($C_p$) 245. However, with alternative embodiments having greater or fewer resistors 210, the position of the mid-point tap, i.e., the eighth first switch node 215, may vary. According to the present invention, the applied voltage $V_{DD}$ is divided in half in a first step for estimating the digital equivalent of the sampled analog signal using standard approximation techniques, described more specifically below. Also, in FIG. 5, a total parasitic capacitor 250 is measured in the second level switching module 230, which is a sum of all of the parasitic capacitors 245 in each of the resistor banks 200. It should be noted, however, that the total parasitic capacitor 250 need not be measured only in the second level switching module 230, but may be measured anywhere that can properly sum all parasitic capacitors 245 of the resistor banks 200.

In operation, an analog signal is sampled and an input signal therefrom is applied to comparator 148. Meanwhile, $V_{DD}$ 255 is applied across the resistor banks 200. $V_{DD}$ corresponds to the VRH (high voltage reference) of FIG. 4. The operation of the present invention begins at FIG. 3 where the converter state machine provides a Buffer signal and a Final signal to transmission gates 128 and 130 of FIG. 4. These Buffer and Final signals are decoded such that the ninth bit of the SAR register 100 of FIG. 3 is put in the high mode from a low mode. Once in the high mode, the RDAC has a decode scheme that specifically references the first switch node 215 referenced at mid-point tap 260. This mid-point tap 260 provides a scheme for dividing $V_{DD}$ in half to initiate the approximation scheme. Once at the mid-point tap 260, the first switch 220 at the mid-point tap 260 line is closed while the corresponding switch at the second level switching module 230 is left open. By closing the first switch 220 and leaving the second switches in the second level switching module 230 open, the parasitic capacitor 245 is precharged prior to initiation of the conversion process.

Precharging of the parasitic capacitor 245 has distinct advantages. For example, by precharging the parasitic capacitor 245, any RC delay due to the capacitor charging has been removed, which speeds up the overall settling time or overall time constant. Thus, the accuracy of the conversion is improved since the parasitic capacitance has been mimimdized.

It is important to note that the precharging step occurs at the total parasitic capacitor 250 rather than at each individual parasitic capacitor 245. After the charging step of the total parasitic capacitor 250, the appropriate switch 235 of the second level switching module 230 is closed in order to transmit the signal to the sampling capacitor 144 to charge that capacitor. With closing of an appropriate switch or switches of second level switching module 230, the present method proceeds from the sampling process to a conversion process. The conversion process is a conventional SAR conversion process which is shown in FIG. 6.

Figure 6:
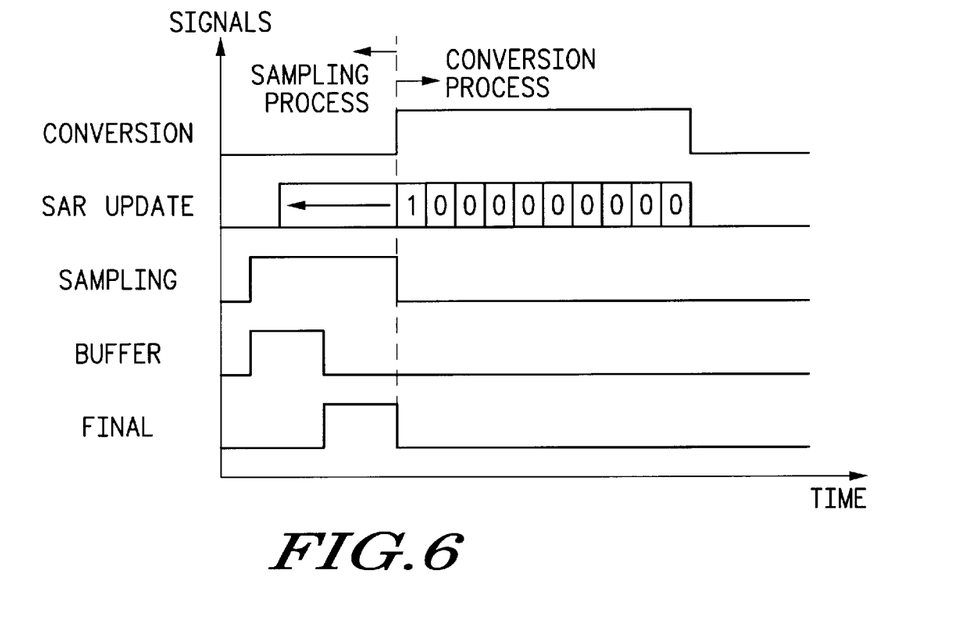
FIG. 6 illustrates a timing diagram of the signals associated with the RDAC of FIG. 5.

FIG. 6 is a timing diagram of the operation process of the RDAC of FIG. 5. In FIG. 6, the Sampling Process and the Conversion Process are shown in the timing diagram. In the Sampling Process, the Conversion has not been done, while the sampling buffer and final have all occurred in addition to the precharging shown in the SAR update. The Buffer being on allows the buffer amplifier 136 to sample the input and apply to the sampling capacitor 144 to provide the rough approximation of the input signal. The Final provides the more exact value to the sampling capacitor 144 of FIG. 4 before comparing the Final value to the RDAC value. The sampling line of FIG. 6 denotes the sampling state during which the Buffer and Final processes are accomplished. The SAR update shows that the precharging of the total parasitic capacitor 250 occurs prior to the Conversion Process and is accomplished by setting the SAR most significant bit (i.e., bit 9) to a high level (i.e., 1), while the remaining bits (0-8) are set to a low level (i.e., 0). The amount of time that the precharging occurs is generally at least two, preferably at three clock cycles before closing of the second switch. In any case, the lag between closing the first and second switches should be sufficient to allow any "glitching" to settle. By "glitching", it is understood that a glitch is a change in voltage over time that is due to closing the first switch 220. Then, the conversion process begins which is a standard conversion process for an SAR analog-to-digital converter.

Particularly, the input signal from the sampled analog signal is supplied to the comparator 148. A comparison signal (initially, one-half $V_{DD}$) is then placed on $C_{SAMP}$ 144, by closing first switch 220 associated with mid-point tap 260. The comparison signal is then compared to the input signal at the comparator 148. As a result of the comparison, the comparator generates a high or low signal, corresponding to the input signal being greater or less than the comparison signal (one-half $V_{DD}$ initially). The feedback loop then continues until all bits in the SAR 100 are filled with high and low values, which is the digital representation of the input signal. Particularly, additional first switches are closed, followed by closing additional second switches, whereby respective comparison signals are placed on $C_{SAMP}$, and hence to the comparator. In this way, the SAR continues to be updated until the digital signal equivalent is placed in the SAR. For example, if the input signal is higher than the comparison signal (one-half $V_{DD}$ in the first step), a high value is placed in the ninth bit of the SAR. Then, the first switch 200 associated with the first switch node 215 at the mid-point between the mid-point tap 260 and the last of the first switch nodes (i.e., the first switch 200 at the ¾ position), is closed. The appropriate second switch is then closed and a new comparison signal is then applied to $C_{SAMP}$ 144 and to the comparator. A series of high and low values is then placed in SAR 100, which represents a close digital approximation of the input signal.

While the present invention has been described above with particularity, it is understood that one of ordinary skill in the art may modify or alter aspects of the present invention and still fall within the scope of the present invention as claimed below.

What is claimed is:

1. A circuit for use in an analog to digital converter, the circuit comprising:

a plurality of serially connected resistors;

a voltage supply applied across the plurality of serially connected resistors;

a plurality of nodes, each of the plurality of nodes positioned between adjacent ones of the plurality of serially connected resistors;

a plurality of first switches, each of the plurality of first switches coupled to a corresponding one of the plurality of nodes;

a plurality of second switches; and a parasitic capacitor connected between the plurality of first switches and the plurality of second switches the parasitic capacitor undergoing charging when a first one of the plurality of first switches is closed.

2. A circuit according to claim 1 further comprising a sampling capacitor, the sampling capacitor coupled to the plurality of second switches opposite the parasitic capacitor.

3. A circuit according to claim 2 wherein a first one of the plurality of second switches is operable to be closed a first predetermined time after the first one of the plurality of first switches is closed so as to charge the sampling capacitor from the parasitic capacitor.

4. A circuit according to claim 2 further comprising a comparator coupled to the sampling capacitor.

5. A circuit according to claim 1 wherein the plurality of serially coupled resistors and the plurality of nodes are arranged in a plurality of resistor banks.

6. A circuit according to claim 5 wherein the parasitic capacitor is a total parasitic capacitor, and further comprising a plurality of individual parasitic capacitors, each one of the plurality of individual parasitic capacitors associated with a corresponding one of the plurality of resistor banks.

7. A circuit according to claim 6 wherein one of the plurality of nodes of each of the plurality of resistor banks is a mid-point tap, and the plurality of individual parasitic capacitors are positioned at corresponding ones of the mid-point tap of each one of the plurality of resistor banks.

8. A circuit according to claim 5 further comprising a plurality of buses, each of the plurality of buses coupled to a corresponding one of the plurality of resistor banks and a corresponding one of the plurality of second switches.

9. A circuit according to claim 1 further comprising a bus, the bus comprising a plurality of connections, each of the plurality of connections coupled to a corresponding one of the plurality of first switches and a corresponding one of the plurality of second switches.

10. An analog to digital converter comprising:

a resistor network comprising a plurality of resistor banks, each one of the plurality of resistor banks comprising a plurality of serially connected resistors and a plurality of nodes positioned between adjacent one of the plurality of serially connected resistors:

a voltage supply applied across the plurality of resistor banks;

a plurality of first switches for selecting corresponding ones of the plurality of nodes;

a plurality of second switches for selecting any one of the plurality of resistor banks of the plurality of resistor banks; and a parasitic capacitor connected between the plurality of first switches and the plurality of second switches, the parasitic capacitor charged when both a first switch of the plurality of first switches is closed and a corresponding one of the plurality of second switches is opened.

11. An analog to digital converter according to claim 10 further comprising a sampling capacitor coupled to the plurality of second switches.

12. An analog to digital converter according to claim 11 wherein the plurality of second switches are operable to charge the sampling capacitor from the parasitic capacitor.

13. An analog to digital converter according to claim 10 wherein the parasitic capacitor is a total parasitic capacitor, and further comprising a plurality of individual parasitic capacitors, each one of the plurality of individual parasitic capacitors associated with a corresponding one of the plurality of resistor banks.

14. An analog to digital converter according to claim 13 wherein one of the plurality of nodes of each of the plurality of resistor banks is a mid-point tap, and the plurality of individual parasitic capacitors are positioned at corresponding ones of the mid-point tap of each one of the plurality of resistor banks.

15. An analog to digital converter according to claim 10 further comprising a plurality of buses, each of the plurality of buses coupled to a corresponding one of the plurality of resistor banks and a corresponding one of the plurality of second switches.

16. An analog to digital converter according to claim 15 wherein each of the plurality of buses has a plurality of connections coupled to corresponding ones of the plurality of first switches.

17. An analog to digital converter comprising:

a voltage supply; and analog circuits, the analog circuits comprising:
  a comparator;
  a sampling capacitor coupled to the comparator; and
  a resistor digital to analog converter (RDAC) coupled to the voltage supply and the sampling capacitor, the RDAC comprising:
    a resistor network comprising a plurality of resistor banks, each resistor bank of the plurality of resistor banks comprising a plurality of serially connected resistors and a plurality of nodes, each node of the plurality of nodes positioned between adjacent resistors of the plurality of serially connected resistors, a first node of the plurality of nodes of each of the plurality of resistor banks being designated as a mid-point tap;
    a plurality of first switches, each switch of the plurality of first switches coupled to a corresponding node of the plurality of nodes, the switch of each of the plurality of first switches coupled to the mid-point tap of each of the plurality of nodes being designated as a first switch of each of the plurality of first switches;
    a plurality of first parasitic capacitors, each capacitor of the plurality of first parasitic capacitors coupled to the first switch of each of the plurality of first switches, the plurality of first parasitic capacitors undergoing charging by the voltage supply when the corresponding one of the first switch is in a closed position;
    a plurality of buses, each bus of the plurality of buses coupled to corresponding resistor banks of the plurality of resistor banks at the first switch of each of the plurality of first switches; and
    a second level switching module coupled to the plurality of buses, the second level switching module comprising a plurality of second switches.

18. An analog to digital converter according to claim 17 further comprising a second parasitic capacitor, the second parasitic capacitor operable to sum the capacitance of the plurality of first parasitic capacitors.

19. An analog to digital converter according to claim 18 further comprising a sampling capacitor coupled to the plurality of second switches; and wherein the plurality of second switches are operable to charge the sampling capacitor from the second parasitic capacitor.

* * * * *